United States Patent
Oh et al.

(10) Patent No.: US 8,879,339 B2
(45) Date of Patent: Nov. 4, 2014

(54) WRITE CONTROL DEVICE

(75) Inventors: Byoung Chan Oh, Seoul (KR); Yoon Jae Shin, Gyeonggi-do (KR)

(73) Assignee: SK Hynix Inc., Icheon (KR)

( * ) Notice: Subject to any disclaimer, the term of this patent is extended or adjusted under 35 U.S.C. 154(b) by 258 days.

(21) Appl. No.: 13/592,265

(22) Filed: Aug. 22, 2012

(65) Prior Publication Data

US 2013/0308400 A1 Nov. 21, 2013

(30) Foreign Application Priority Data

May 21, 2012 (KR) .................. 10-2012-0053895

(51) Int. Cl.
*G11C 7/00* (2006.01)

(52) U.S. Cl.
USPC ..................... 365/189.16; 365/148

(58) Field of Classification Search
CPC .. G11C 13/0069; G11C 8/08; G11C 11/1675; G11C 13/0023; G11C 16/10; G11C 7/1057
USPC ............................ 365/189.16, 148
See application file for complete search history.

(56) References Cited

U.S. PATENT DOCUMENTS

| | | | |
|---|---|---|---|
| 2010/0128552 A1 | 5/2010 | Kang | |
| 2010/0235714 A1* | 9/2010 | Toda | 714/763 |
| 2010/0290273 A1* | 11/2010 | Yoon et al. | 365/163 |
| 2011/0058411 A1 | 3/2011 | Rim | |
| 2012/0051127 A1* | 3/2012 | Yoon et al. | 365/163 |
| 2012/0106243 A1* | 5/2012 | Lym et al. | 365/163 |
| 2012/0257437 A1* | 10/2012 | Seko et al. | 365/148 |
| 2012/0307547 A1* | 12/2012 | Park et al. | 365/148 |
| 2013/0208530 A1* | 8/2013 | Oh et al. | 365/148 |
| 2014/0043887 A1* | 2/2014 | Lym et al. | 365/148 |
| 2014/0063905 A1* | 3/2014 | Ahn et al. | 365/148 |

* cited by examiner

*Primary Examiner* — Tuan T Nguyen

(57) ABSTRACT

A write control device includes a switching unit configured to selectively supply a write current in response to a driving control signal, a driving unit configured to supply a driving current to a memory cell corresponding to the write current applied through the switching unit, and an over-driving control unit coupled to an output node of the driving unit and configured to over-drive the output node in response to the driving control signal.

19 Claims, 8 Drawing Sheets

WRITE CONTROL DEVICE

CROSS-REFERENCE TO RELATED APPLICATION

The priority of Korean patent application No. 10-2012-0053895 filed on May 21, 2012, the disclosure of which is hereby incorporated in its entirety by reference, is claimed.

BACKGROUND OF THE INVENTION

The present invention relates to a write control device, and more specifically, to a technology for rapidly performing a write operation of a nonvolatile memory device configured to sense data based on resistance change.

Generally, memory devices may be classified as volatile memory devices or nonvolatile memory devices. A nonvolatile memory device includes a nonvolatile memory cell capable of preserving stored data even when a power source is off. A nonvolatile memory device may be implemented, for example, as a flash random access memory (RAM) device, a phase change RAM (PCRAM) device, or the like.

PCRAM devices include memory cells that are implemented using a phase change material, for example, germanium antimony tellurium (GST), and are configured to store data in the memory cells by applying heat to the GST so that the GST changes into a crystalline phase or an amorphous phase.

A nonvolatile memory device, such as a magnetic memory device, a phase change memory (PCM) device, or the like, has a data processing speed similar to that of a volatile RAM device. However, unlike a volatile RAM device, a nonvolatile memory device preserves data even when a power source is off.

FIGS. 1a and 1b illustrates a conventional phase change resistance device 4.

Referring to FIGS. 1a and 1b, a conventional phase change resistance device 4 includes an upper electrode 1, a lower electrode 3, and a phase change material 2 interposed between the upper electrode 1 and the lower electrode 3. When a voltage is applied to the upper electrode 1 and the lower electrode 3, a current flows into the phase change material 2, thus inducing a high temperature in the phase change material 2. As a result, the electrical conductive state of the phase change material 2 changes depending on resistance variation due to the high temperature.

FIGS. 2a and 2b illustrate a phase change principle of the conventional phase change resistance device 4.

Referring to FIG. 2a, if a low current smaller than a critical value flows into the phase change resistance device 4, the phase change material 2 is crystallized. When the phase change material 2 changes into a crystalline phase, it becomes a low resistance material. As a result, a current can flow between the upper electrode 1 and the lower electrode 3.

On the other hand, referring to FIG. 2b, if a high current greater than the critical value flows into the phase change resistance device 4, the phase change material 2 has a temperature higher than a quenching point. When the phase change material 2 changes into an amorphous phase, i.e., a non-crystalline phase, it becomes a high resistance material. As a result, a current cannot easily flow between the upper electrode 1 and the lower electrode 3.

The phase change resistance device 4 can store data corresponding to two resistance phases. That is, in one case, if a low resistance phase in the phase change resistance device corresponds to a data "1," and a high resistance phase corresponds to a data "0," then the phase change resistance device 4 may store two logic states of data.

This data can be stored in the phase change resistance device 4 as nonvolatile data because the status of the phase change material 2 does not change even when a power source is off.

FIG. 3 illustrates a write operation of a conventional phase change resistance cell.

Referring to FIG. 3, heat is generated if a current flows between the upper electrode 1 and the lower electrode 3 of the phase change resistance device 4 for a given time.

If a low current, smaller than the critical value, flows for a given time, the phase change material 2 changes into a crystalline phase. As a result, the phase change resistance device 4 becomes a low resistance element having a set phase.

On the other hand, if a high current, greater than the critical value, flows for a given time, the phase change material 2 changes into an amorphous phase. As a result, the phase change resistance device 4 becomes a high resistance element having a reset phase.

Accordingly, a low voltage is applied to the phase change resistance device 4 for a long period of time in order to write the set phase in the write operation.

On the other hand, a high voltage is applied to the phase change resistance device 4 for a short period of time in order to write the reset phase in the write operation.

To change the phase change resistance cell into the set phase, it is important to control a quenching slope of a set write current, which is required for crystallizing the phase change resistance cell, by gradually reducing an amount of the set write current. This way of gradually reducing the set write current is called "quenching."

However, for example, if a reference current, which is used to generate the set write current and is received from the outside or generated inside the chip, changes by some factors or if a clock having a wrong value is generated by mismatched circuits, the set write current may be generated with an undesired quenching slope.

Moreover, without accurately checking the quenching slope, it is impossible to precisely control the phase change resistance cell in program and verify (PNV) operations and a multi-level cell MLC where multi-leveled resistance distribution of a phase change material, e.g., germanium antimony tellurium (GST), is formed.

Meanwhile, a conventional nonvolatile memory device controls a driving voltage supplied to a memory cell array in a program operation using a write driving unit.

The write driving unit is configured to stably supply a write current even though the write current has a small current value. However, it takes a much longer time to supply cells with the write current when using a small current value than when using a large current value.

That is, when the write driving unit supplies a small write current to the cells, it takes much longer to supply the current because of parasitic components on a write path.

FIG. 4 illustrates a write time that is delayed by a large parasitic component and a small write current. Here, $I_T$ represents a driving current flowing in a driving transistor of the write driving unit, and $I_M$ represents a cell current flowing in a memory cell.

Referring to FIG. 4, the driving current $I_T$ flowing in the driving transistor reaches a stabilized current level after a settling time $t_{settling}$ passes. In addition, there is a time delay due to parasitic components on a write path. A time delay $t_{DELAY}$ occurs in a period of time where the driving current $I_T$ of the driving transistor is transmitted to the memory cell.

A small write current is generally determined by characteristics of cells and the size of a cell array. As the size of the cell array becomes larger, the delay time occurring due to the parasitic components on the write path also become greater.

In this way, the write time becomes longer by the small write current and the large size of the cell array. A conventional write driving unit has not introduced improvements to such a write time delay phenomenon.

BRIEF SUMMARY OF THE INVENTION

Embodiments of the present invention are directed to improving a write time delay phenomenon due to a small write current and large parasitic components on a write path of a cell array having a large size. The present invention provides a write driving unit with an adjusted size ratio of driving transistors, so that the write driving unit may provide a write current that is stabilized in a short time. Also, the driving transistors are over-driven using a voltage drop generated at an output node of the write driving unit for a given time in an initial period of a write operation so as to reduce transmission delay to memory cells. Moreover, diode-coupled transistors, coupled to the driving transistors, are turned on due to the voltage drop so as to reduce the transmission delay.

According to an embodiment of the present invention, a write control device comprises: a switching unit configured to selectively supply a write current in response to a driving control signal; a driving unit configured to supply a driving current to a memory cell corresponding to the write current applied through the switching unit; and an over-driving control unit coupled with an output node of the driving unit and configured to over-drive the output node in response to the driving control signal.

The write control device further comprises a voltage supply unit configured to precharge the over-driving control unit during an inactivation period of the driving control signal.

During the inactivation period of the driving control signal, the voltage supply unit is turned on and the switching unit is turned off to charge the over-driving control unit, and during an activation period of the driving control signal, the voltage supply unit is turned off and the switching unit is turned on so that the write current is supplied to the driving unit.

The over-driving control unit comprises a capacitor coupled between the driving unit and the output node.

The over-driving control unit comprises a first transistor coupled between the driving unit and the output node and having a gate and a source which are commonly coupled with each other.

The first transistor includes a PMOS transistor.

The driving unit comprises driving transistors each having a different size.

The driving unit comprises: a second transistor coupled between a power voltage applying terminal and the switching unit and having a gate and a drain which are commonly coupled with each other; and a third transistor coupled between the power voltage applying terminal and the output node and having a gate which is commonly coupled with the second transistor.

The second transistor and the third transistor include PMOS transistors.

The second transistor has a larger size than that of the third transistor.

The write control device further comprises a current supplying unit configured to generate the write current so as to output the write current to the switching unit.

The current supplying unit has a current mirror structure.

The current supplying unit includes a current source.

The driving unit supplies the driving current to a write path coupled with the memory cell.

The over-driving control unit over-drives the output node during an initial period of a write operation where the driving control signal is activated.

DESCRIPTION OF EMBODIMENTS

Exemplary embodiments of the present invention will be described in detail with reference to the attached drawings.

Figure 1A:
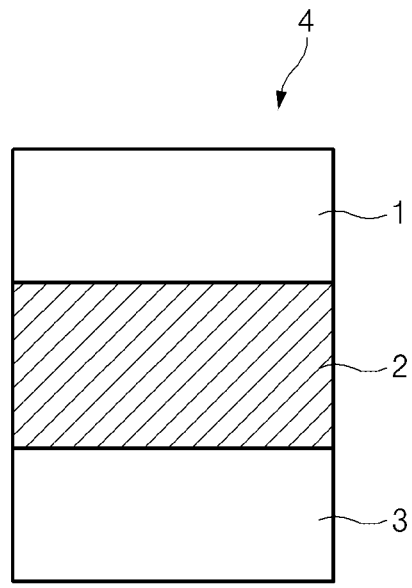
FIGS. 1a and 1b illustrate a conventional phase change resistance device and a phase change principle of the conventional phase change resistance device.
Figure 1B:
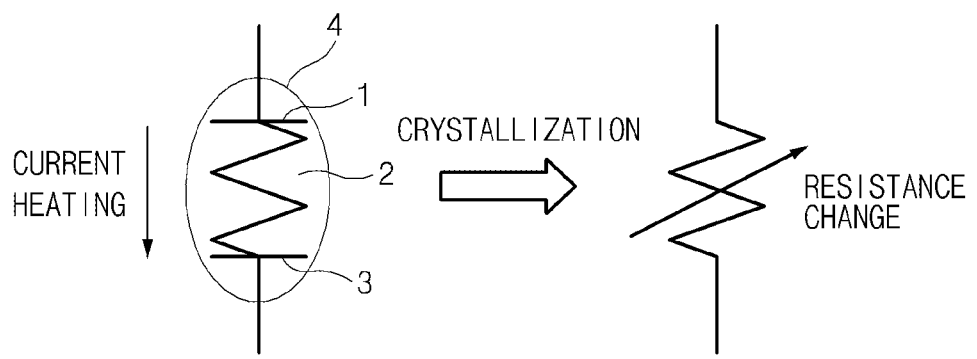
Figure 2A:
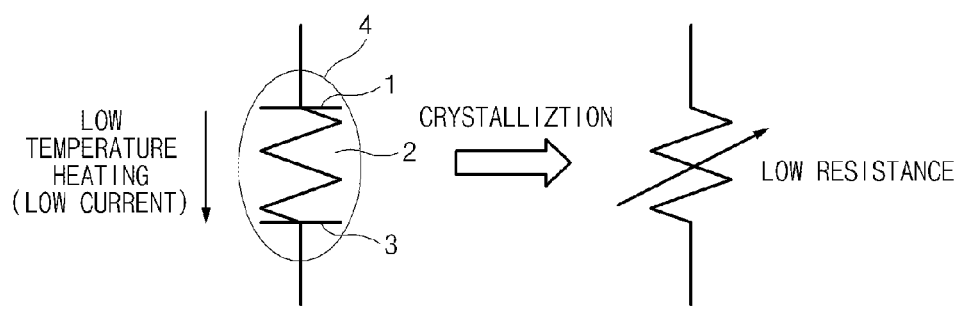
FIGS. 2a and 2b illustrate a phase change principle of the conventional phase change resistance device.
Figure 2B:
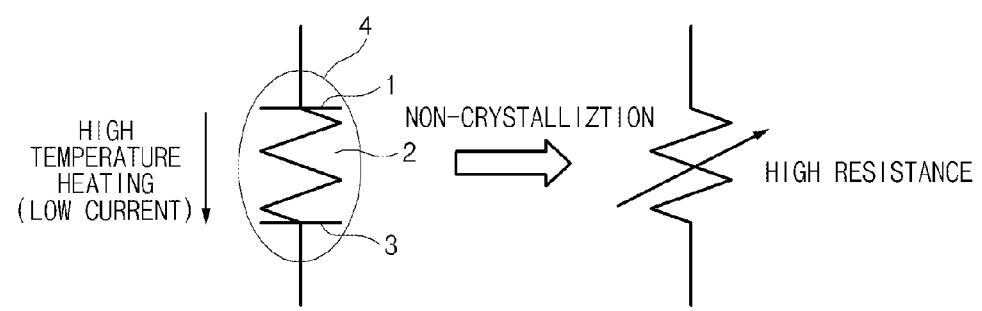
Figure 3:
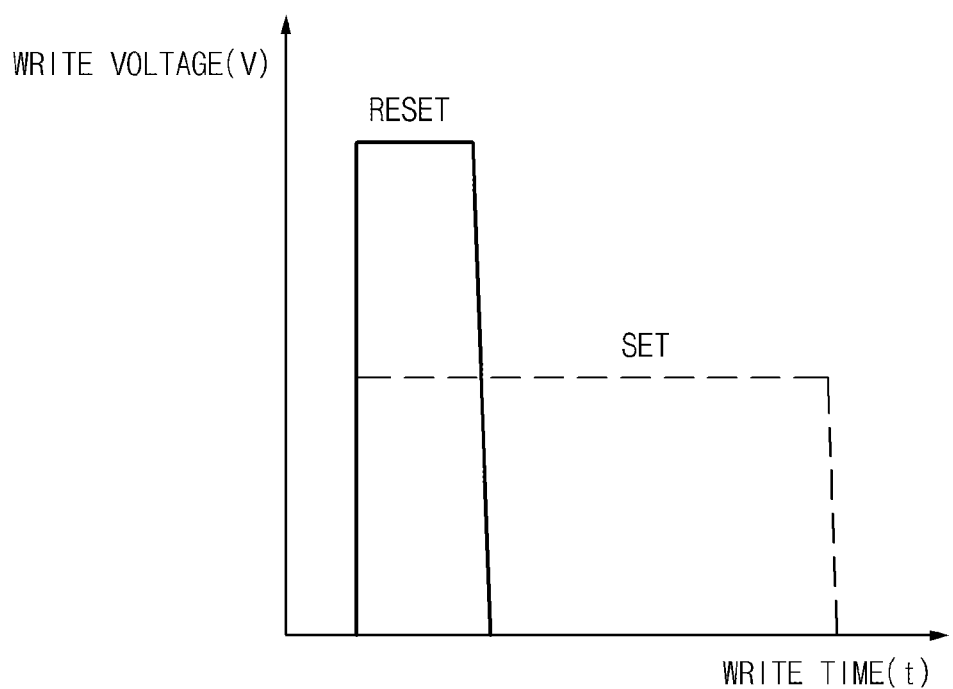
FIG. 3 illustrates a write operation of a conventional phase change resistance cell.
Figure 4:
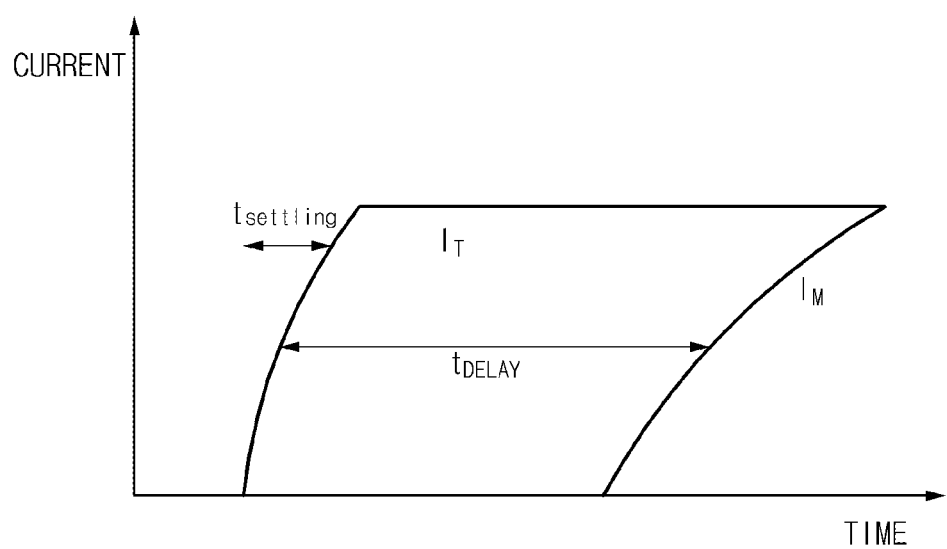
FIG. 4 illustrates a write current and a write time in a conventional write driving unit.
Figure 5:
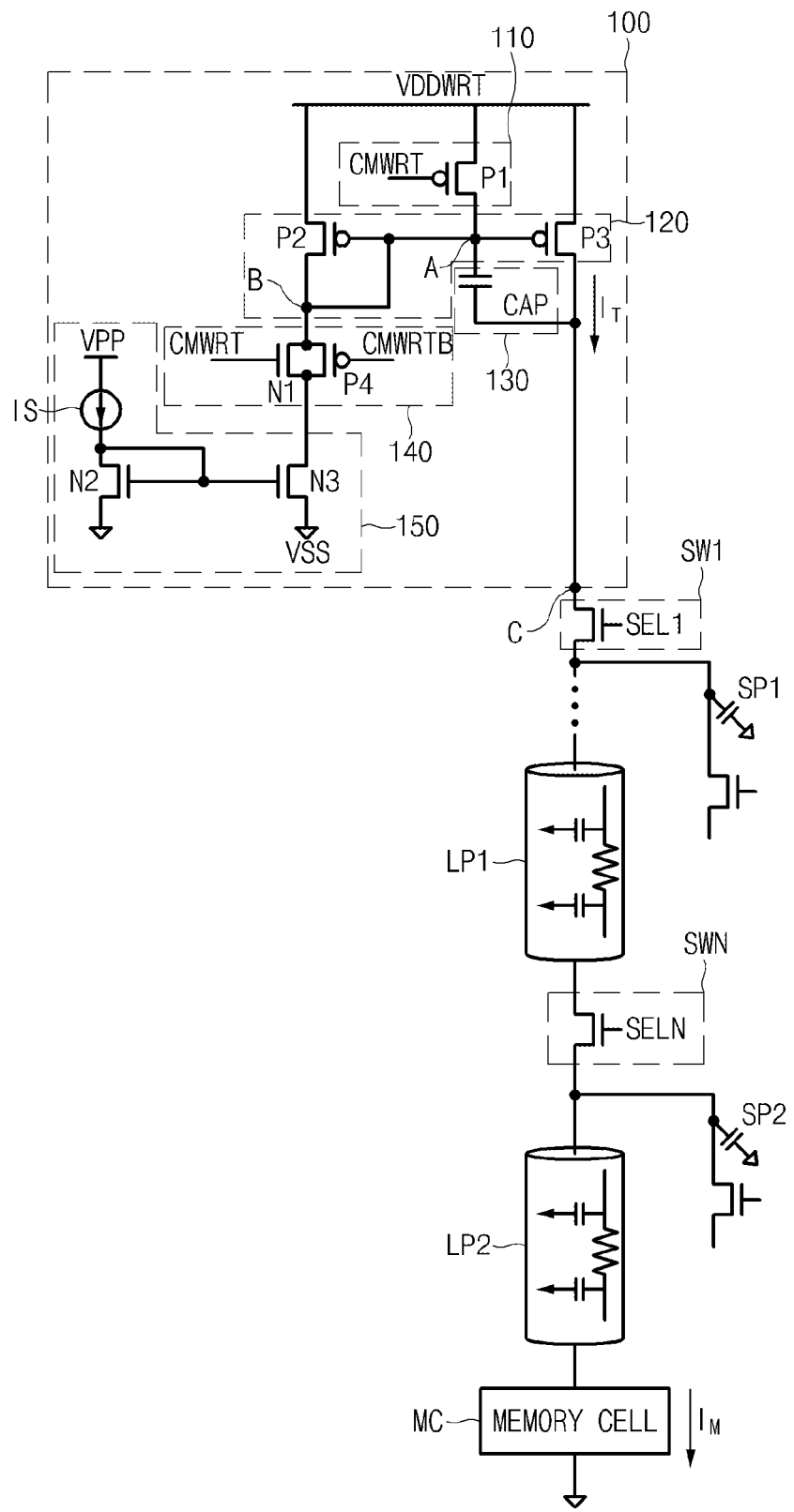
FIG. 5 illustrates a write control device according to an embodiment of the present invention.

FIG. 5 illustrates a write control device according to an embodiment of the present invention.

Referring to FIG. 5, the write control device includes a write driving unit 100. The write driving unit 100 is coupled to a memory cell MC through a plurality of selection switches SW1~SWN and supplies a driving current to the memory cell MC.

The write driving unit 100 includes a voltage supply unit 110, a driving unit 120, an over-driving control unit 130, a switching unit 140, and a current supply unit 150.

The voltage supply unit 110 includes a PMOS transistor P1 coupled to and disposed between a power voltage (VDDWRT) terminal and a node A. The PMOS transistor P1 has a gate to receive a driving control signal CMWRT.

The driving unit 120 includes PMOS transistors P2 and P3. The PMOS transistor P2 is coupled to and disposed between the power voltage terminal and a node B and has a gate coupled to the nodes A and B. The PMOS transistor P3 is coupled to and disposed between the power voltage terminal and a node C and has a gate coupled to the node A.

The PMOS transistor P2 has a different size from the PMOS transistor P3. In an embodiment of the present invention, the PMOS transistor P2 has a larger size than that of the PMOS transistor P3.

The over-driving control unit 130 includes a capacitor CAP coupled to and disposed between the nodes A and C.

The switching unit 140 includes an NMOS transistor N1 and a PMOS transistor P4, which are coupled in parallel to and disposed between the node B and an NMOS transistor N3 in the current supply unit 150. The NMOS transistor N1 has a gate to receive the driving control signal CMWRT. The PMOS transistor P4 has a gate to receive an inverted driving control signal CMWRTB, which is an inversion signal of the driving control signal CMWRT.

The current supplying unit 150 includes NMOS transistors N2 and N3, which are formed with a current mirror structure, and a current source IS driven by a pumping voltage VPP.

The NMOS transistor N2 is coupled to and disposed between the current source IS and a ground voltage terminal and has a gate coupled to the current source IS. The NMOS transistor N3 is coupled to and disposed between the switching unit 140 and the ground voltage terminal and has a gate coupled to the gate of the NMOS transistor N2.

The plurality of selection switches SW1~SWN is formed on a write path between the write driving unit 100 and the memory cell MC. The plurality of selection switches SW1~SWN are selectively activated in response to selection signals SEL1~SELN.

Parasitic capacitance SP1 and SP2 may exist between the node C and the memory cell MC by non-selected switches. In addition, parasitic resistance and capacitance on line LP1 and LP2 may exist between the node C and the memory cell MC.

In this case, a point of time where a write current generated in the write driving unit 100 reaches the memory cell MC may be delayed.

Thus, in an embodiment of the present invention, the PMOS transistors P2 and P3 included in the driving unit 120 are formed to have different sizes from each other so as to prevent a transmission time of the write current from increasing by the parasitic components such as the parasitic capacitance SP1 and SP2, and the parasitic resistance and capacitance on line LP1 and LP2.

Figure 6:
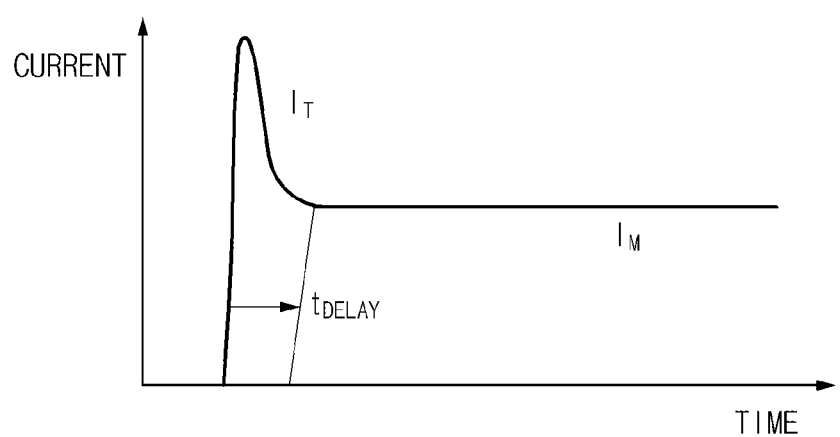
FIG. 6 illustrates a write current and a write time in the write driving unit shown in FIG. 5.

Referring to FIG. 6, an operation of the write control device shown in FIG. 5 will be explained hereinafter.

A first current supplied from the current source IS is transmitted to the NMOS transistors N2 and N3. If the NMOS transistors N2 and N3, having the current mirror structure, are turned on in response to the first current, a second current having a low level is transmitted to the switching unit 140.

If the driving control signal CMWRT is at a high level and the driving control signal CMWRTB is at a low level, the switching unit 140 is turned on to transfer the second current to the node B.

If the node B has a low level, the PMOS transistors P2 and P3 are turned on. As a result, a driving current $I_T$ is outputted through the PMOS transistors P2 and P3, which are driving transistors. The driving current $I_T$ is transmitted into the memory cell MC through the node C.

In a period where the driving control signal CMWRT has a high level to turn on the switching unit 140, the PMOS transistor P1 maintains a turn-off state. On the other hand, the PMOS transistor P1 is turned on to precharge the capacitor CAP with a power voltage VDDWRT in a period where the driving control signal CMWRT has a low level to turn off the switching unit 140.

That is, when the driving control signal CMWRT is at the low level, the PMOS transistor P1 is turned on and the switching unit 140 is turned off to charge the capacitor CAP. On the other hand, when the driving control signal CMWRT is at the high level, the PMOS transistor P1 is turned off and the switching unit 140 is turned on to transmit the second current into the PMOS transistors P2 and P3.

At the time when the PMOS transistors P2 and P3 are turned on, the driving current $I_T$ is transmitted into the node C. At an initial period of time when the driving control signal CMWRT is activated, the driving current $I_T$ flowing in the node C rises to a high level, as shown in FIG. 6, by a voltage charged in the capacitor CAP.

After the driving current $I_T$ is initially transmitted into the node C to start a write operation, a voltage drop is generated at the node C by the capacitor CAP. As a result, in an embodiment of the present invention, an over-driving operation is performed in the driving unit 120 by the over-driving control unit 130, i.e., the capacitor CAP coupled between the nodes A and C. In this case, a current value of the driving current $I_T$ can be differently adjusted depending on voltage change at the node C.

Thus, it is shown that a write time is decreased corresponding to a delay time $t_{DELAY}$ in the period of time where the driving current $I_T$ flowing in the driving transistors P2 and P3 is initially transmitted into the memory cell MC. $I_M$ in FIG. 6 represents a cell current flowing in the memory cell MC.

In an embodiment, the PMOS transistor P2 included in the driving unit 120 has a larger size than the PMOS transistor P3. As a result, when a voltage at the node B is applied thereto, a gate voltage of the PMOS transistor P2 is rapidly stabilized by the PMOS transistor P2 where a larger current is flowing.

As a result, the driving current $I_T$ flowing in the PMOS transistor P3 is rapidly stabilized.

Figure 7:
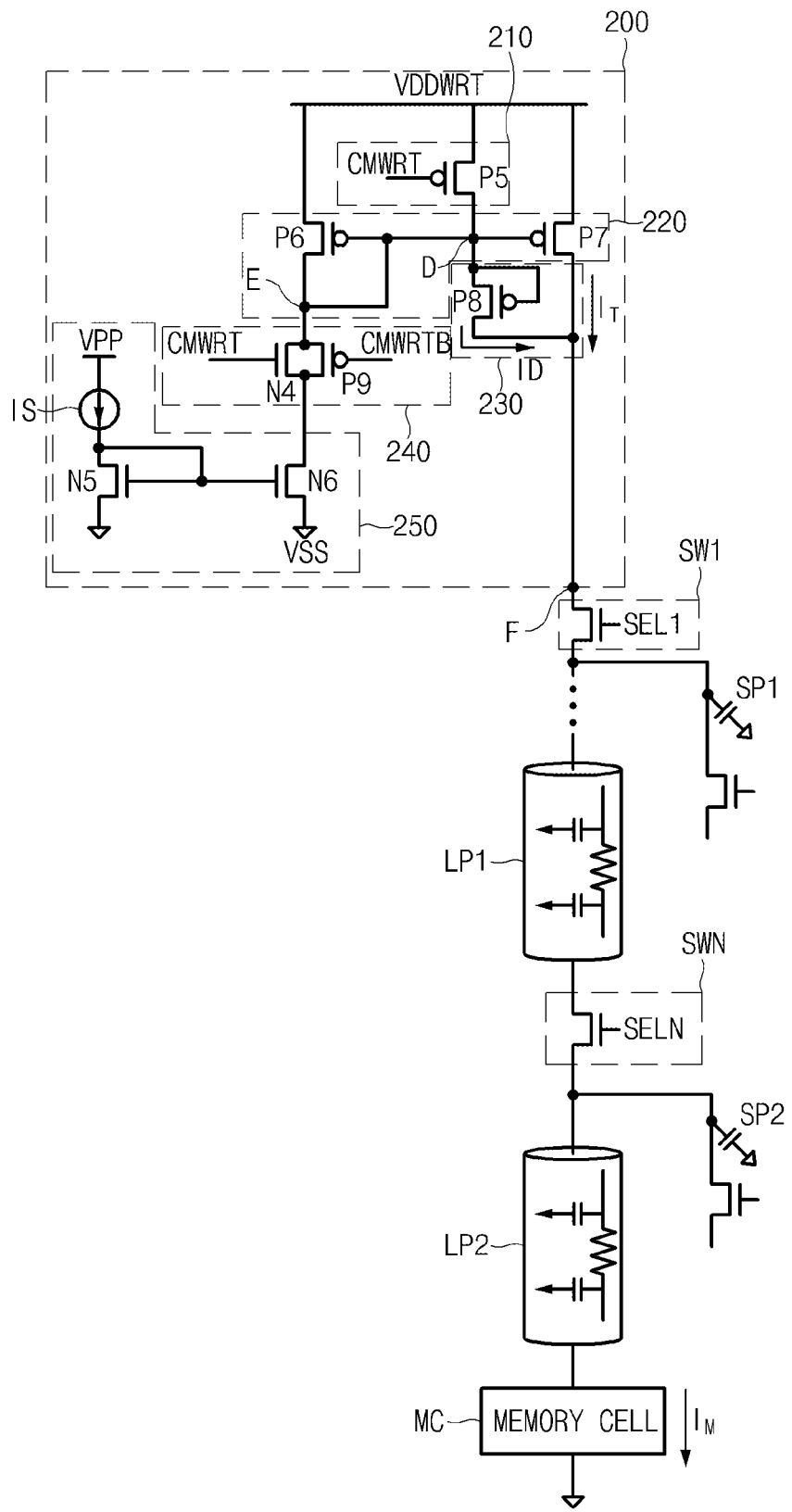
FIG. 7 illustrates a write control device according to another embodiment of the present invention.

FIG. 7 illustrates a write control device according to another embodiment of the present invention.

Referring to FIG. 7, the write control device includes a write driving unit 200. The write driving unit 200 is coupled with a memory cell MC through a plurality of selection switches SW1~SWN and supplies a driving current to the memory cell MC.

The write driving unit 200 includes a voltage supply unit 210, a driving unit 220, an over-driving control unit 230, a switching unit 240, and a current supply unit 250.

The voltage supply unit 210 includes a PMOS transistor P5 coupled to and disposed between a power voltage (VDDWRT) terminal and a node D. The PMOS transistor P5 has a gate to receive a driving control signal CMWRT.

The driving unit 220 includes PMOS transistors P6 and P7. The PMOS transistor P6 is coupled to and disposed between the power voltage terminal and a node E and has a gate coupled to the nodes D and E. The PMOS transistor P7 is coupled to and disposed between the power voltage terminal and a node F and has a gate coupled to the node D.

The PMOS transistor P6 has a different size from the PMOS transistor P7. In an embodiment of the present invention, the PMOS transistor P6 has a larger size than the PMOS transistor P7.

The over-driving control unit 230 includes a PMOS transistor P8 configured to have a diode structure. The PMOS transistor P8 is coupled to and disposed between the nodes D and F and has a gate coupled to the node D.

The switching unit 240 includes an NMOS transistor N4 and a PMOS transistor P9, which are coupled in parallel to and disposed between the node E and an NMOS transistor N6 in the current supply unit 250. The NMOS transistor N4 has a gate to receive the driving control signal CMWRT. The PMOS transistor P9 has a gate to receive an inverted driving control signal CMWRTB, which is an inversion signal of the driving control signal CMWRT.

The current supplying unit 250 includes NMOS transistors N5 and N6, which are formed with a current mirror structure, and a current source IS driven by a pumping voltage VPP.

The NMOS transistor N5 is coupled to and disposed between the current source IS and a ground voltage terminal, and has a gate coupled to the current source IS. The NMOS transistor N6 is coupled to and disposed between the switching unit 240 and the ground voltage terminal and has a gate coupled to the gate of the NMOS transistor N5.

The plurality of selection switches SW1~SWN is formed on a write path between the write driving unit 200 and the memory cell MC. The plurality of selection switches SW1~SWN are selectively activated in response to selection signals SEL1~SELN.

Parasitic capacitance SP1 and SP2 may exist between the node F and the memory cell MC by non-selected switches. In addition, parasitic resistance and parasitic capacitance on lines LP1 and LP2 may exist between the node F and the memory cell MC.

In this case, the point of time when a write current generated in the write driving unit 200 reaches the memory cell MC may be delayed.

Thus, in an embodiment of the present invention, the PMOS transistors P6 and P7 included in the driving unit 220 are formed to have different sizes from each other so as to prevent a transmission time of the write current from increasing because of the parasitic components such as the parasitic capacitance SP1 and SP2, and the parasitic resistance and capacitance on lines LP1 and LP2.

Figure 8:
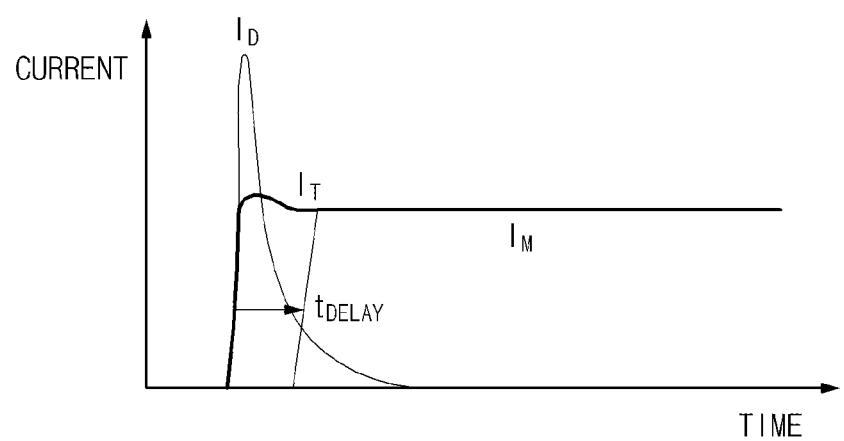
FIG. 8 illustrates a write current and a write time in the write driving unit shown in FIG. 7.

Referring to FIG. 8, an operation of the write control device shown in FIG. 7 will be explained hereinafter.

A first current supplied from the current source IS is transmitted into the NMOS transistors N5 and N6. If the NMOS transistors N5 and N6, having the current mirror structure, are turned on in response to the first current, a second current having a low level is transmitted into the switching unit 240.

If the driving control signal CMWRT is at a high level and the driving control signal CMWRTB is at a low level, the switching unit 240 is turned on to transfer the second current to the node E.

If the node E has a low level, the PMOS transistors P6 and P7 are turned on. As a result, a driving current $I_T$ is outputted through the PMOS transistors P6 and P7, which are driving transistors. The driving current $I_T$ is transmitted to the memory cell MC through the node F.

In a period when the driving control signal CMWRT has a high level to turn on the switching unit 240, the PMOS transistor P5 maintains a turn-off state. On the other hand, the PMOS transistor P5 is turned on to precharge the PMOS transistor P8 with a power voltage VDDWRT in a period when the driving control signal CMWRT has a low level to turn off the switching unit 240.

That is, when the driving control signal CMWRT is at the low level, the PMOS transistor P5 is turned on and the switching unit 240 is turned off to charge the PMOS transistor P8. On the other hand, when the driving control signal CMWRT is at the high level, the PMOS transistor P5 is turned off and the switching unit 240 is turned on to transmit the second current into the PMOS transistors P6 and P7.

At the time when the PMOS transistors P6 and P7 are turned on, the driving current $I_T$ is transmitted to the node F. At an initial period of time when the driving control signal CMWRT is activated, the node F is at a low level and the gate of the PMOS transistor P7 is at a high level.

Thus, the PMOS transistor P8 is turned on, a current ID flows in the PMOS transistor P8. At an initial period of time when the driving control signal CMWRT is activated, the current ID flowing in the PMOS transistor P8 rises to a high level, as shown in FIG. 8, by a voltage charged in the PMOS transistor P8. Depending on the rise of the current ID, a current level of the driving current $I_T$ rises for a given period.

In a period when a write operation is performed, when a voltage level at the node F rises by the driving current $I_T$, the current ID gradually decreases. Finally, only the driving current $I_T$ flows through a write path by the PMOS transistor P7.

That is, at a point of time when the driving current $I_T$ is initially transmitted into the node F to start the write operation, a voltage drop is generated at the node F. As a result, in an embodiment of the present invention, since the diode-coupled PMOS transistor P8 is coupled to and disposed between the nodes D and F so as to perform an over-driving operation, a current value of the driving current $I_T$ can be adjusted depending on the voltage change at the node F.

Thus, according to an embodiment of the present invention, a write time is decreased corresponding to a delay time $t_{DELAY}$ in the period of time when the driving current $I_T$ flowing in the driving transistors P6 and P7 is transmitted to the memory cell MC. $I_M$ in FIG. 8 represents a cell current flowing in the memory cell MC.

The PMOS transistor P6 included in the driving unit 220 has a larger size than the PMOS transistor P7. As a result, when a voltage at the node E is applied thereto, a gate voltage of the PMOS transistor P6 is rapidly stabilized by the PMOS transistor P6 where a larger current is flowing.

As a result, the driving current $I_T$ flowing in the PMOS transistor P7 is rapidly stabilized, and the over-driven current cannot affect the memory cell MC.

In an embodiment of the present invention, even though large parasitic components exist on a write path of a write driving unit to a memory cell, a write operation can be rapidly performed with a small current.

Accordingly, the present invention has the following benefits.

First, the present invention can improve a write time delay generated by large parasitic components on a write path of a cell array having a large size.

Second, the present invention provides a write driving unit with an adjusted transistor size ratio so that the write driving unit can supply a write current that is stabilized in a short time.

Third, since driving transistors in the write driving unit can be over-driven by a voltage drop that is generated at an output node of the write driving unit for a given time in an initial period of a write operation, a transmission delay of the write current to memory cells can be reduced.

Fourth, since diode-coupled transistors are turned on by the voltage drop generated at the output node of the write driving unit, the transmission delay can be reduced.

Although a number of illustrative embodiments consistent with the present invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings, and the accompanying claims. In addition to variations and modifications in the component parts and/or arrangements, alternative uses will also be apparent to those skilled in the art.

What is claimed is:

1. A write control device, comprising:
a switching unit configured to selectively supply a write current in response to a driving control signal;
a driving unit configured to supply a driving current to a memory cell corresponding to the write current applied through the switching unit; and
an over-driving control unit coupled to an output node of the driving unit and configured to over-drive the output node in response to the driving control signal.

2. The write control device according to claim 1, further comprising a voltage supply unit configured to precharge the over-driving control unit during an inactivation period of the driving control signal.

3. The write control device according to claim 2, wherein the voltage supply unit comprises a PMOS transistor coupled to and disposed between a power voltage terminal and the over-driving control unit.

4. The write control device according to claim 2, wherein, during the inactivation period of the driving control signal, the voltage supply unit is activated while the switching unit is deactivated to charge the over-driving control unit, and, during an activation period of the driving control signal, the voltage supply unit is deactivated while the switching unit is activated to supply the write current to the driving unit.

5. The write control device according to claim 1, wherein the over-driving control unit comprises a capacitor coupled to the driving unit to over-drive the output node.

6. The write control device according to claim 1, wherein the over-driving control unit comprises a first transistor that is coupled to the driving unit to over-drive the output node and has a gate and a source, which are coupled to each other.

7. The write control device according to claim 6, wherein the first transistor includes a PMOS transistor.

8. The write control device according to claim 1, wherein the driving unit comprises driving transistors having different sizes.

9. The write control device according to claim 1, wherein the driving unit comprises:
    a first driving transistor coupled between a power voltage terminal and the switching unit and having a gate and a drain, which are coupled to each other; and
    a second driving transistor coupled between the power voltage terminal and the output node and having a gate that is coupled to the gate of the first driving transistor.

10. The write control device according to claim 9, wherein the first and second driving transistors include PMOS transistors.

11. The write control device according to claim 9, wherein the first driving transistor has a larger size than the second driving transistor.

12. The write control device according to claim 1, further comprising a current supplying unit configured to generate the write current.

13. The write control device according to claim 12, wherein the current supplying unit has a current mirror structure.

14. The write control device according to claim 12, wherein the current supplying unit includes a current source.

15. The write control device according to claim 1, wherein the driving unit is configured to supply the driving current to the memory cell through a write path.

16. The write control device according to claim 9, wherein the over-driving control unit comprises a capacitor coupled to and disposed between the gate of the second driving transistor and the output node of the driving unit.

17. The write control device according to claim 9, wherein the over-driving control unit comprises a first transistor that is coupled to and disposed between the gate of the second driving transistor and the output node of the driving unit and that has a gate and a source, which are coupled to each other.

18. The write control device according to claim 17, wherein the first transistor includes a PMOS transistor.

19. The write control device according to claim 1, wherein the over-driving control unit over-drives the output node during an initial period of a write operation where the driving control signal is activated.

* * * * *